US 6,851,077 B2

(12) United States Patent
Herzer et al.

(10) Patent No.: US 6,851,077 B2
(45) Date of Patent: Feb. 1, 2005

(54) SEMICONDUCTOR COMPONENT FOR CONTROLLING POWER SEMICONDUCTOR SWITCHES

(75) Inventors: Reinhard Herzer, Ilmenau (DE); Jan Lehmann, Ilmenau (DE); Jürgen Massanek, Nürnberg (DE); Sascha Pawel, Ilmenau (DE)

(73) Assignee: Semikron Elektronik GmbH, Nuremberg (DE)

( * ) Notice: Subject to any disclaimer, the term of this patent is extended or adjusted under 35 U.S.C. 154(b) by 497 days.

(21) Appl. No.: 09/815,165

(22) Filed: Mar. 22, 2001

(65) Prior Publication Data

US 2001/0038296 A1 Nov. 8, 2001

(30) Foreign Application Priority Data

Mar. 22, 2000 (DE) .......................... 100 14 269

(51) Int. Cl.[7] .............................. G11C 29/00
(52) U.S. Cl. ..................... 714/718; 315/224; 361/79
(58) Field of Search .................... 714/718; 315/224; 713/323; 361/79, 59; 340/507; 360/65

(56) References Cited

U.S. PATENT DOCUMENTS

| | | | | | |
|---|---|---|---|---|---|
| 4,247,910 A | * | 1/1981 | Cornell et al. | ........... | 379/88.01 |
| 4,422,109 A | * | 12/1983 | Sampei et al. | ........... | 360/65 |
| 4,649,321 A | * | 3/1987 | Ferraro | ........... | 315/224 |
| 5,182,810 A | * | 1/1993 | Bartling et al. | ........... | 713/323 |
| 5,319,514 A | * | 6/1994 | Walsh et al. | ........... | 361/59 |
| 5,706,237 A | * | 1/1998 | Ciraula et al. | ........... | 365/222 |
| 5,754,103 A | * | 5/1998 | Kanai et al. | ........... | 340/507 |
| 5,935,260 A | * | 8/1999 | Ofer | ........... | 714/42 |
| 6,097,582 A | * | 8/2000 | John et al. | ........... | 361/79 |
| 6,335,893 B1 | * | 1/2002 | Tanaka et al. | ........... | 365/226 |
| 6,504,697 B1 | * | 1/2003 | Hille | ........... | 361/103 |
| 2001/0038296 A1 | | 11/2001 | Herzer et al. | | |

FOREIGN PATENT DOCUMENTS

DE     198 51 186 A1    5/2000

OTHER PUBLICATIONS

Lu, Chih–Yuan et al., "An Analog/Digital BCDMOS Technology with Dielectric Isolation—Devices and Processes", IEEE Transactions On Electron Devices, Feb. 1988, p. 230–239, vol. 35, No. 2.

Vogt, F. et al., "Smart Power with 1200V DMOS", Fraunhofer–Institute of Microelectric Circuits and Systems, 1997, p. 317–320.

Motorola Single IGBT Gate Driver for MC33153 (Catalog), Motorala, Inc. 1995, p. 1–12.

(List continued on next page.)

*Primary Examiner*—Albert Decady
*Assistant Examiner*—Dipakkumar Gandhi
(74) *Attorney, Agent, or Firm*—Darby & Darby

(57) ABSTRACT

A semiconductor component has interface functions between the controller and the power components of power converters, suitable for gating semiconductor switches. In particular, the semiconductor component serves to gate IGBT and MOSFET power switches in low and medium performance three-phase bridge circuits and integrates signal processing (12), level conversion (16) and amplification (gate driver) (17), error recognition, such as short-circuit monitoring by means of VCE detection (19) and operating voltage monitoring (21) as well as error processing (15) for several power semiconductor switches. The advantages of this gating IC in comparison with hybrid or discrete solutions consist of the high integration density of various digital, analogue and driver functions which result in a reduction in the number of discrete components, which means a lower failure rate of the system and lower costs. Another important consideration is the improvement of switching characteristics thanks to monolithic integration. The integrated circuit is less susceptible to interference voltage and has a lower temperature drift than discrete circuits.

12 Claims, 8 Drawing Sheets

OTHER PUBLICATIONS

Semikron Catalog—Power Electronics, 1999, p. A70–A78.

Hewlett Packard Data Sheet HCPL–316J, "2.0 Amp Gate Drive Optocoupler with Integrated (Vce) Desaturation Detection and Fault Status Feedback", Dec. 1997.

International Rectifier Data Sheet No. PD60019I (IR2130/IR2132), p. 191–214.

International Rectifier Data Sheet No. PD60107J (IR2133/IR2135), p. 225–234.

Oppermann, K. et al., "Optimization of LIGBTs in a Dielectric Insulated IC–Technology Using a 'Switched Anode'", Siemens Corporate Research and Development, 1996, p. 239–242.

Nicolai, Ulrich et al., "Applikationshandbuch IGBT–und MOSFET–Leistungsmodule" (Applications book for IGBT and MOSFET Power Modules), 1998, ISBN 3–932633–24–5.

* cited by examiner

SEMICONDUCTOR COMPONENT FOR CONTROLLING POWER SEMICONDUCTOR SWITCHES

BACKGROUND OF THE INVENTION

The invention relates to a semiconductor component with interface functions between the controller and the power components of power converters, suitable for controlling semiconductor components. In particular the present invention related to a semiconductor component for controlling IGBT power switches.

Hybrid control circuits are known from prior art. Such circuit arrangements to control semiconductor power switches are described in the Applikationsbuch IGBT-und MOSFET-Leistungsmodule [Applications for IGBT and MOSFET Power Modules] (ISBN 3-932633-24-5) and in Catalogue '99 of SEMIKRON Electronic GmbH. To explain the control problems, block diagrams will be referred to below.

FIG. 1 shows the principal design of a power electronics system for controlling state-of-art high-voltage IGBTs (Insulated Gate Bipolar Transistors).

In detail, a power electronics system consists of a controller 1 with, for example, microprocessor, memory and A/D or D/A transformer unit. A control circuit 2 has digital, analogue and power components for signal processing, a power supply and error processing. Potential separation 3 is between the low-voltage and high-voltage side. The driver circuit 4 has power supply, gate driver and monitoring. There is an intermediate voltage circuit 5, power switches 6, a load 7, and sensors with evaluation circuits 8.

To demonstrate the connection to the power semiconductor switches, two IGBTs of a half-bridge, the intermediate voltage circuit of the converter and the load (here represented by the motor) are drawn as cutouts from a converter circuit.

The compatible data for recording the state variables of the converter in operation are supplied by sensors for all relevant operating parameters with possible evaluation circuits, with which the state variables of the load and the power switches (e.g. RPM, position, torque or temperature, voltage, current and short circuit) are recorded and transmitted to the control circuit or the controller.

For low-current applications (such as battery or automotive applications with intermediate voltages smaller than 100 V), semiconductor technologies exist today which allow the largely monolithic integration of the controller, the control and driver circuit, potential separation and the recording of state variables. In the case of higher intermediate voltages, the integration of potential separation (or the level converter step) becomes more difficult because of isolation problems. Solutions for the integration of level converter steps up to 600 V and recently also up to 1200 V are found in prior art and are described by International Rectifier (Data Sheet IR2130, IR2235). The advantages of these solutions are the high degree of integration and the resulting low costs. Disadvantages are the limited voltage range and the limited driver performance which decreases as the dielectric strength increases.

The limited applications in connection with the required bootstrap power supply and the non-existing true galvanic separation are a great disadvantage in the prior art. For medium and high performance, it is therefore necessary to have additional optocouplers or transformers and post-amplifiers.

A monolithic potential separation is possible only by means of dielectric isolation technologies such as the sub-carrier technology described by C. Y. Lu (IEEE Transactions on E. D., ED 35 (1998), pp. 230–239), wafer bonds with trench isolation according to K. G. Oppermann & M. Stoisiek (ISPSD 1996 Proc., pages 239–242) or the SIMOX technology according to Vogt et al (ISPSD 1997 Proc., pp.317–320). Because of the achievable oxide thicknesses of smaller than 2 μm, these are usually limited to isolation voltages smaller than 1200 V (usually 600 V), and they are also very expensive.

In practice, for voltages of more than 100 V, discrete optocouplers or transformers are used for potential separation between the low and high voltage sides. The advantage of transformers versus optocouplers is the bidirectional data flow for control signals. Furthermore, only with them is potential-free power transmission for the power supply of the high-voltage side possible. An advantage is that transformers require a clearly higher control capacity for signal transmission.

When discrete optocouplers or transformers are used, separate, discrete or integrated circuits are required on the low-voltage as well as on the high-voltage side. In certain cases (e.g. low performance, few analogue functions), a monolithic integration of the functions on the low-voltage side with the controller is possible.

Another conventional possibility is hybrid integration of optocoupler modules with an integrated circuit with the driver and monitoring functions (on the high-voltage side) in a special housing (Hewlett Packard Data Sheet HCPL-316., 12/97). This allows a high degree of functional integration for high voltages (of 800 V to 1200 V) as well as medium and high performance.

Only the high-voltage diode for monitoring the voltage between the collector and the emitter (VCE) because of a possible short circuit on the IGBT, the power supply for the high-voltage side and a few passive components difficult to integrate, or components for optional functions, must be supplemented discretely per branch in the driver circuit.

In the case of hybrid IGBT control circuits with galvanic separation of the primary side from the secondary side by means of optocouplers, a fast coupler is used for the signal path, and a usually slower second coupler is used for error messages.

Integrated components already exist for VCE and supply voltage monitoring on the high-voltage or secondary side (Motorola Data Sheet MC 33 153). The potential-free voltage supply for the secondary side is accomplished with a DC/DC transformer because of the greater performance required. Usually, the supply voltage is stabilized via a series-regulator circuit. If voltage is supplied on the secondary side with a DC/DC transformer, the three BOTTOM switches of an A.C. half-bridge circuit are generally combined into one voltage supply.

The functions of the low-voltage side (such as signal processing, error processing, power supply) are accomplished according to prior art by means of discrete components or, in particular the digital functions, by the controller.

In DE 198 51 186, a circuit is presented in which all functions of the primary side, such as controlling, monitoring and power supply, are accomplished by power components (MOSFET or IGBT) in a three-phase bridge circuit for a medium performance range. This integrated circuit must provide all the interface functions between the controller and the six drivers and the IGBT switches of the high-voltage side. For potential separation to the secondary side (high-voltage side), octocouplers (for control signals) according to conventional technology are used, and for the driver and monitoring functions on the secondary side, one circuit is used for each power switch.

OBJECTS AND SUMMARY OF THE INVENTION

It is an object of the present invention to overcome the foregoing problems of the conventional technologies.

The present invention has the objective to present a monolithically integrated semiconductor component for a direct gate control and monitoring of several semiconductor switches in a converter.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
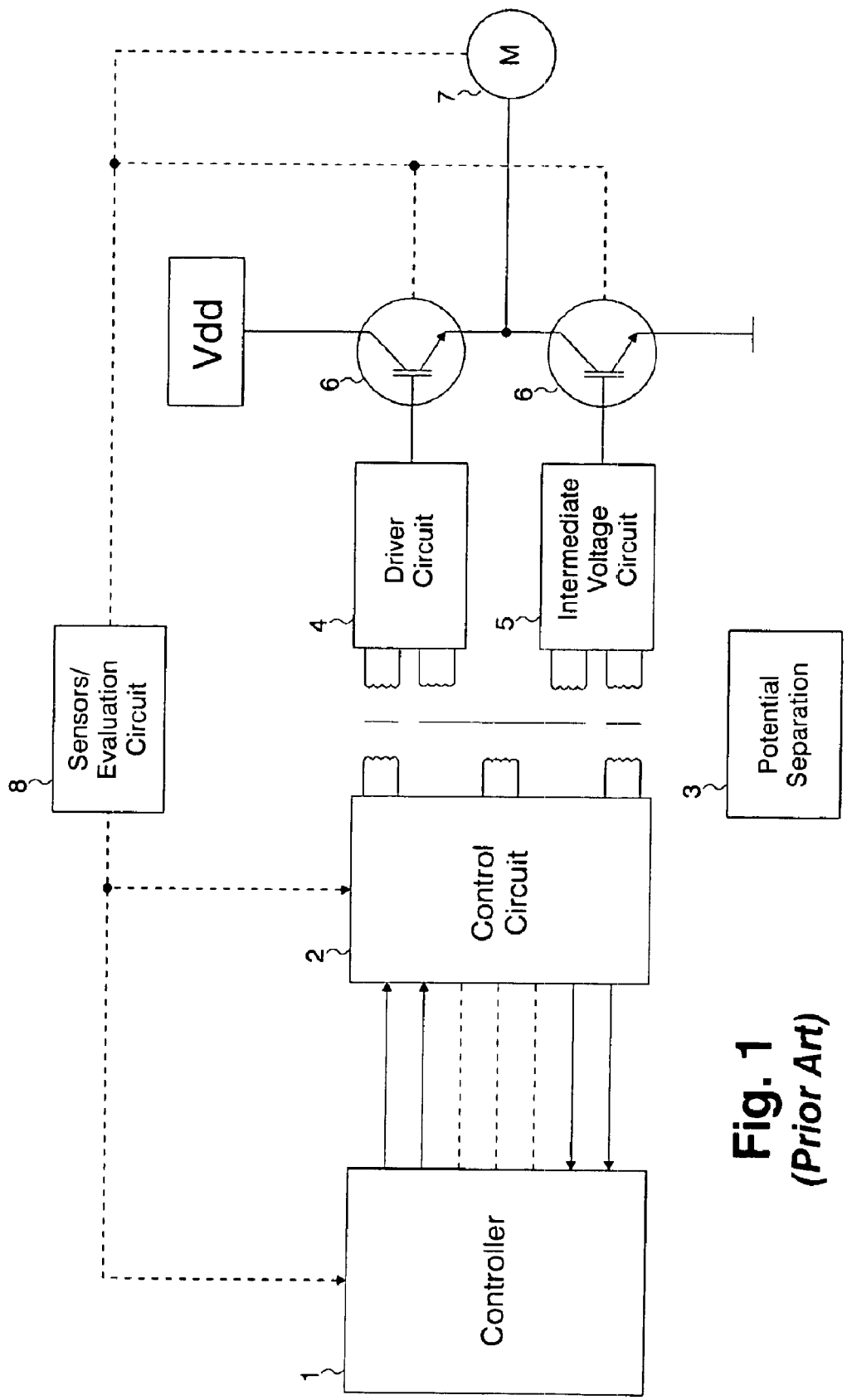
FIG. 1 shows a conventional design of a power electronics system for controlling high-voltage IGBTs.
Figure 2:
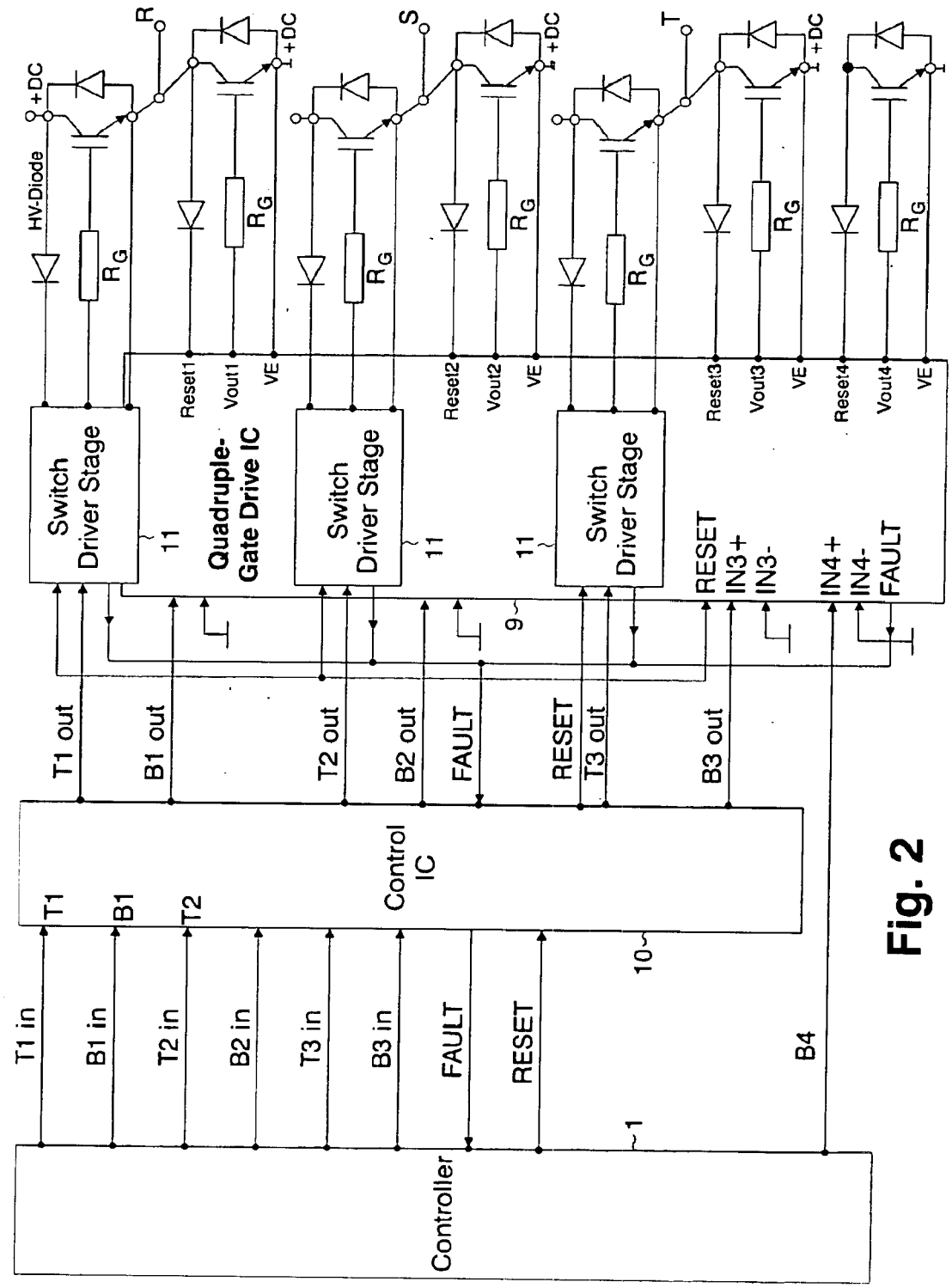
FIG. 2 shows a three-phase bridge circuit.

The semiconductor component according to the invention is explained by means of the example of a three-phase bridge circuit as shown in FIG. 2, supplemented by an additional seventh switch, which can be used as a brake or for reactive-power improvement (phase improvement). The component combines a level conversion as well as the driver and monitoring functions of the 3 BOTTOM switches of the three IGBT half-bridges and of the additional seventh switch, resulting in a monolithically integrated quadruple-gate driver IC 9. This driver IC for 4 semiconductor switches has the same potential as the control IC 10 on the primary side and the controller 11. The control circuit and the controller can have a common potential with the BOTTOM switch provided that interference voltages caused by parasitic effects are relatively small in the system. This is often the case in power components for low and medium performance (less than 150 A, up to 1200 V) and three-phase bridge-circuit modules of very compact design, where the internal inductivities and resistances can be kept at a minimum by the design. The separate driver stages of the 3 TOP switches 11 if the three half-bridges can have positive intermediate voltage of +DC (e.g. 300 V to 1200 V). For reasons of isolation, they must have potential separation (e.g. by means of optocouplers). The control system in FIG. 2 also comprises a controller 1 and a control IC on the primary side 10.

As an example, a semiconductor component is presented which has been realized in CMOS high-voltage technology, in which the following functions are implemented for 4 GBT gate drivers:

- level conversion (multiple), short-impulse suppression, signal delay adaptation 12,
- startup logic (power-on reset—POR) 22,
- gate driver for normal IGBT on and off,
- gate driver for slow powering-off when an IGBT short-circuits,
- internal production 20 and monitorong 21 of operating voltage,
- short-circuit monitoring of the IGBT by means of collector-emitter voltage detection 19, and
- error recognition 1, 19 and error messages 14, 15, and 16.

Figure 3A:
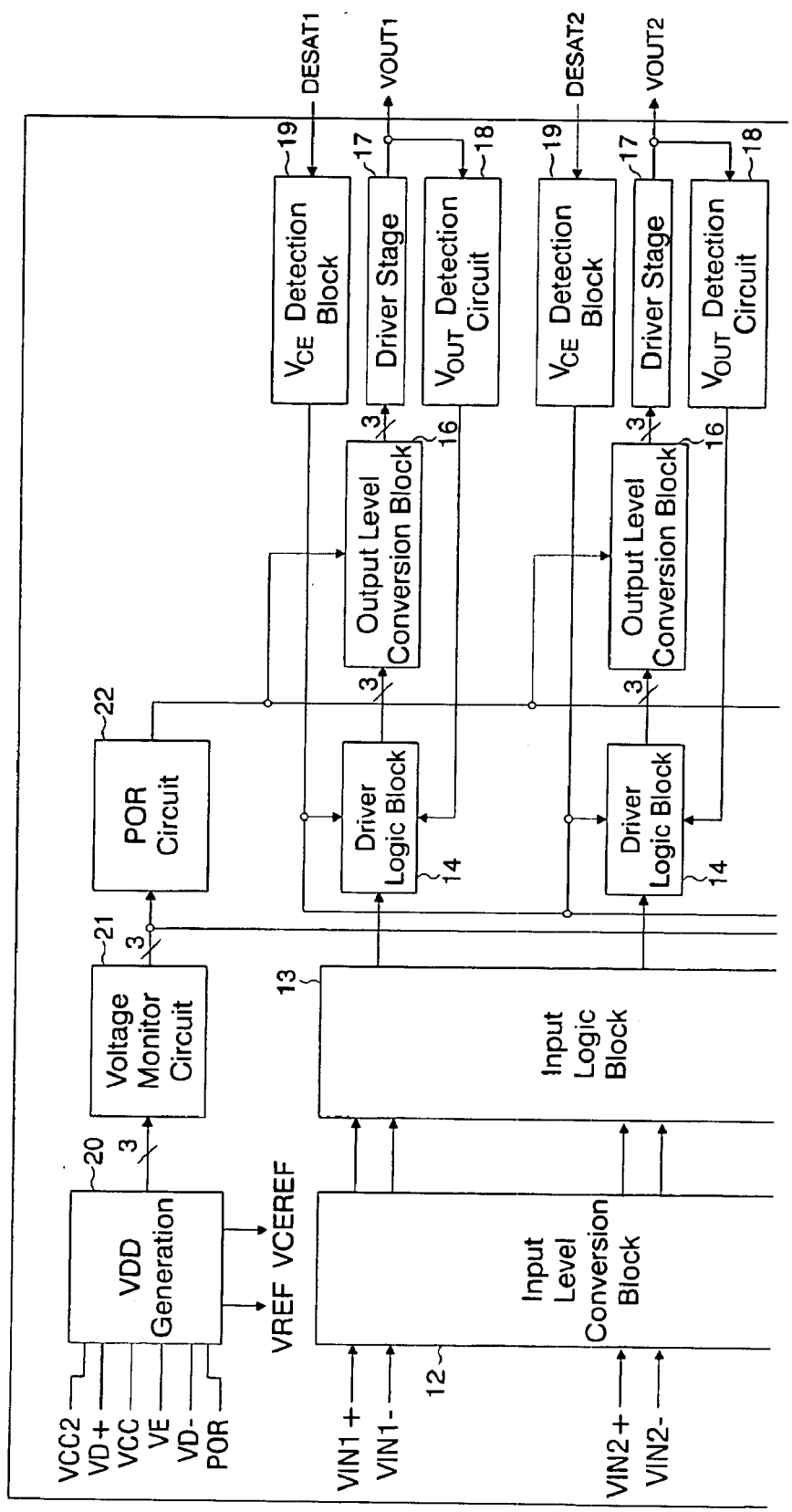
FIG. 3 shows a detailed block diagram of the semiconductor component of the present invention.
Figure 3B:
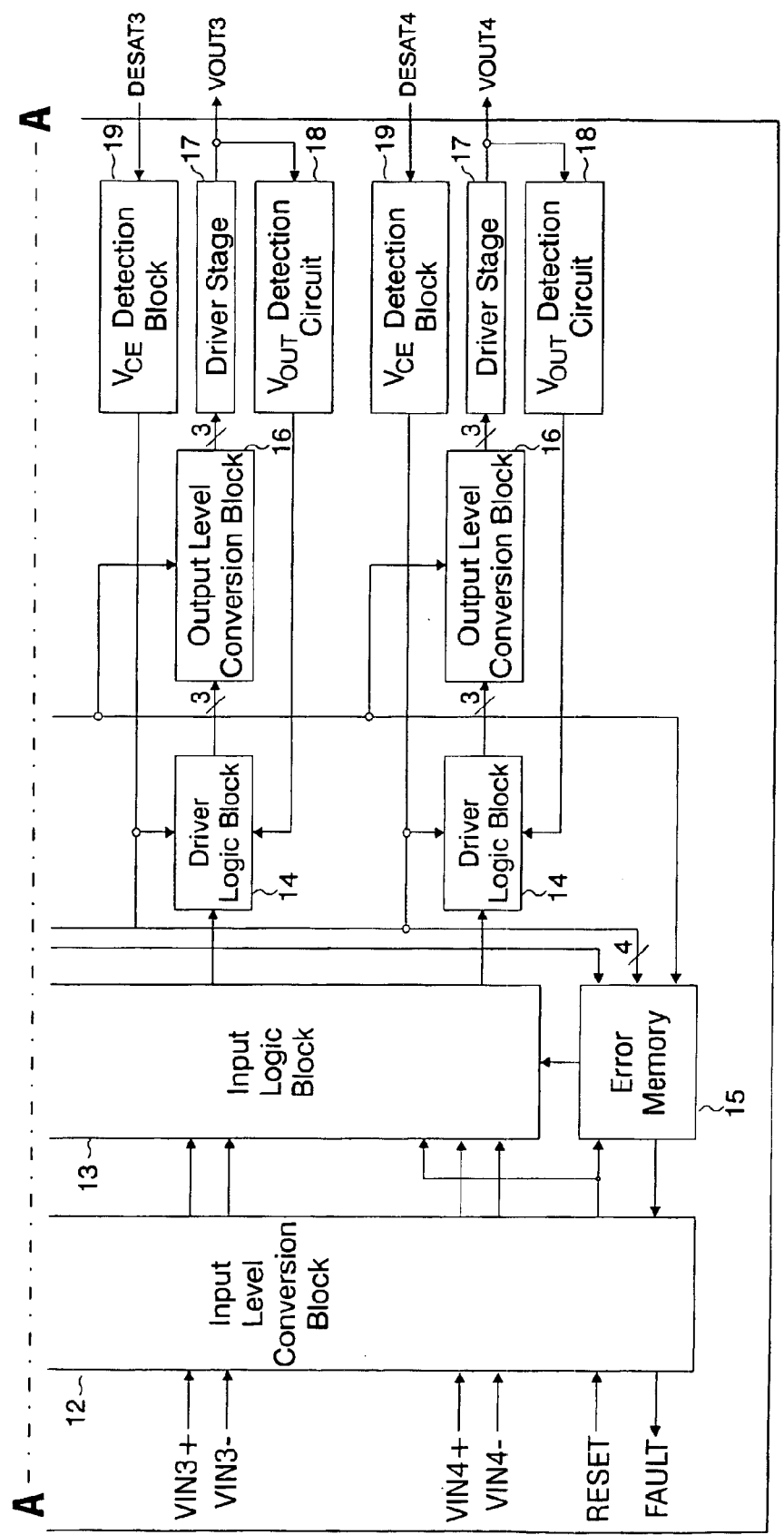

The inventive solution of the quadruple gate-driver IC is explained by means of a detailed block diagram in FIG. 3, which contains the most important circuit components, functions, connections, inputs and outputs of the semiconductor component. The individual inputs and outputs have the following functions:

- VIN1+ to VIN4+: control inputs for signals from the controllers to turn on the 4 IGBTs (3×BOT–IGBT of the half-bridges and for the seventh switch); High active,
- VIN1– to VIN4–: control inputs (see above); Low active,
- VD+: operating voltage to turn on the IGBTs, as a rule 15 V,
- VD–: operating voltage to turn off the IGBTs, variable between 0V and –15 V,
- VCC1: 5 V operating voltage,
- VE: reference potential,
- RESET: input for reset impulse from the controller,
- FAULT: output for error message,
- VOUT1–VOUT4: outputs to the various IGBT switches (Gate), and
- DESAT1–DESAT4: port of the separate high-voltage diodes with which the collector-emitter potential is picked up directly at the collector of the IGBT in question for short-circuit monitoring.

The quadruple-gate driver IC is able to process positive as well as negative switching signals from the controller. These signals are converted to internal logic levels in the input-level conversion block 12. Signals <170 ns are interpreted as interference signals and automatically suppressed. Furthermore, the signal delay within the integrated gate driver is adapted to the signal delay of the gate drivers of the TOP switches (with slow optocouplers).

In the input-logic block 13, the valid positive and negative switching signals are logically linked to each other and to the RESET signal by the controller 1, a possible error signal in the error memory 15 and the power-on reset—POR 22. An error signal will block the signal paths, while after a RESET signal, the error memory is reset and the signal path is enabled again.

The driver-logic block 14 included the following switching functions:

- mutual blocking of the p- and n-MOS gate-driver steps for turning the IGBTs on and off (blocking time about 15 ns),
- local error memory for VCE errors by the IGBT switch in questions, and control of soft power-off in case of a short circuit,
- separation of the various control signals for ON (p-MOSFET), OFF (n-MOSFET) and short-circuit power-off (n-MOSFET with reduced current capacity), and
- resetting the local VCE error memory after soft power-off.

In case of a VCE error, the IGBT in question is softly powered off immediately, and an error signal is given via the error memory 15 to the microprocessor 1 (FAULT output). Internally, the error signal, via the error memory 15 and the input logic 13 causes the hard powering-off of the other 3 BOTTOM IGBTs. The power-off signals for the hard powering-off of the TOP IGBTs are generated by the control IC on the primary side or the controller from the FAULT signal. Correspondingly, this error procedure is followed also when a VCE error occurs in a TOP IGBT.

In the output-level conversion block 16, the 5 V control signals are transformed into VD+ levels (usually 15 V for powering on) or into VD− levels (voltages between 0 V and −15 C for powering off).

The driver stages 17 for hard powering-on of the IGBTs in question (p-MOSFET) and the hard powering-off (n-MOSFET) are designed in multiple stages and have a peak current capacity of max. 3 A. Thus, for example, 3 1200 V IGBT switches can be controlled directly up to 150 A. The additional n-MOSFET driver stage for the soft powering-off in case of a short circuit has only a fraction (e.g. one tenth) of this current capacity, which means a slow powering-off process and thus the prevention of problems such as overvoltages, oscillations, and dynamic stresses including the destruction of the IGBT.

The VOUT detection circuit 18 monitors the voltage drop at output VOUT during soft powering-off. If the condition VOUT=(VD−+1V) is met, the hard powering-off process is initiated to shorten the remaining powering-off process, and the local VCE error memory in the driver logic 14 is reset.

The collector potential at the IGBT is directly picked up via a discrete high-voltage diode (HV diode, see FIG. 2). In the VCE detection block 19, the collector-emitter voltage at an IGBT is detected following a certain time lag after powering-on. In case or normal powering-on, the collector voltage has dropped to the saturation voltage of IGBT after the time lag (e.g. VCE<4 V). In case of a short circuit in the load, the IGBT desaturates, which means that the voltage drop via the collector-emitter path, for example, is greater than 7 V. If a voltage drop greater than 7 V is detected at the VCE detection, the IGBT in question is softly powered off immediately via the driver logic 14. Through an external circuit at pin DESAT, the VCEs at threshold and the time lag can be adapted, if necessary, to the IGBT used and to the application.

While the operating voltages of VCC1 (+5 V) and VD+ (+15 V) are usually given, VD− can be changed between 0V and −15 V, depending on the application. For that reason, an automatic internal voltage supply is necessary for the logic (VDD− generation 20). In that case, the voltage is regulated as VDD=VD−+5V.

In the operating voltage monitoring block 21, VD+, VD− and VDD are monitored for undervoltage. If undervoltages occur at one of the operating voltages, the safe operation of the power component is no longer ensured, and the IGBTs are given their powering-off impulses via the error memory 15 and the VOUT driver stage 17. The error memory can only be reset by means of a RESET by the controller if the error (FAULT) is eliminated.

The POR circuit 22 blocks the driver circuit while the operating voltages are running up after startup. At the same time, the output driver stages are set so that no bridge short-circuit can occur (n-MOSFET: ON; p-MOSFET: OFF). If the undervoltage thresholds of all 3 operating voltages are exceeded, the driver voltage is released.

Figure 4:
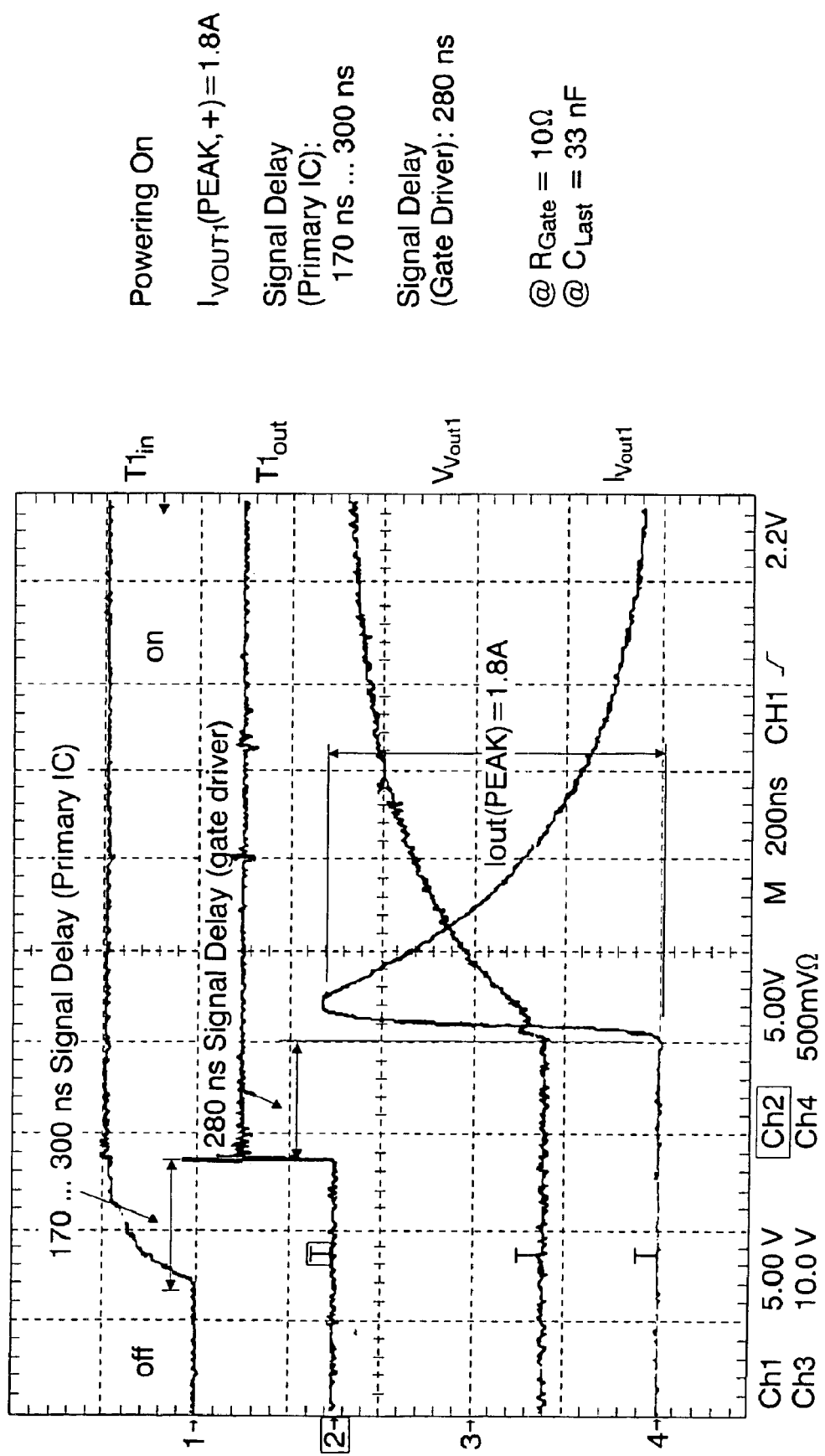
FIG. 4 shows the driver capacity of the gae driver for the powering-on process.
Figure 5:
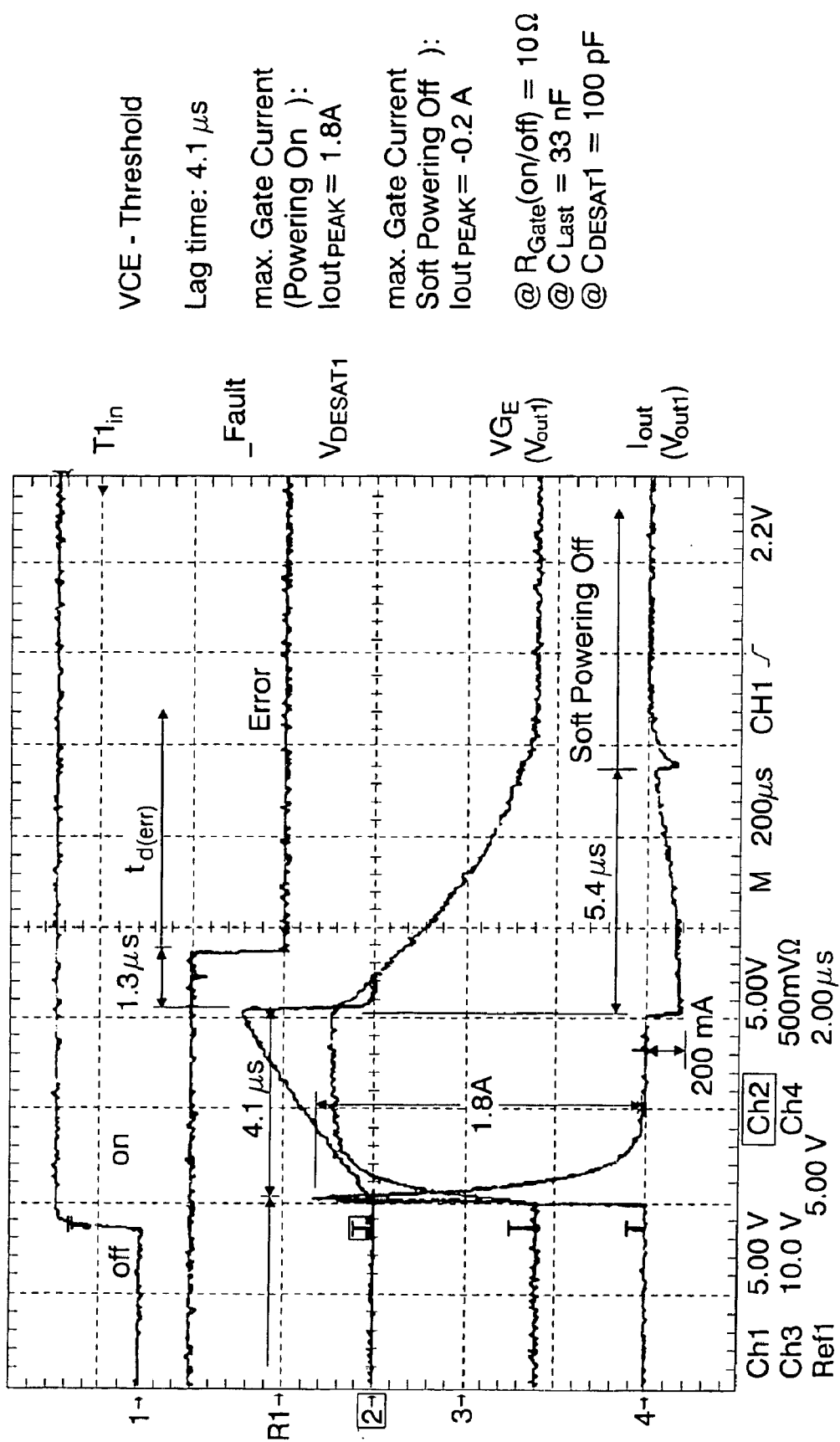
FIG. 5 shows the measured powering on and off in case of error.
Figure 6:
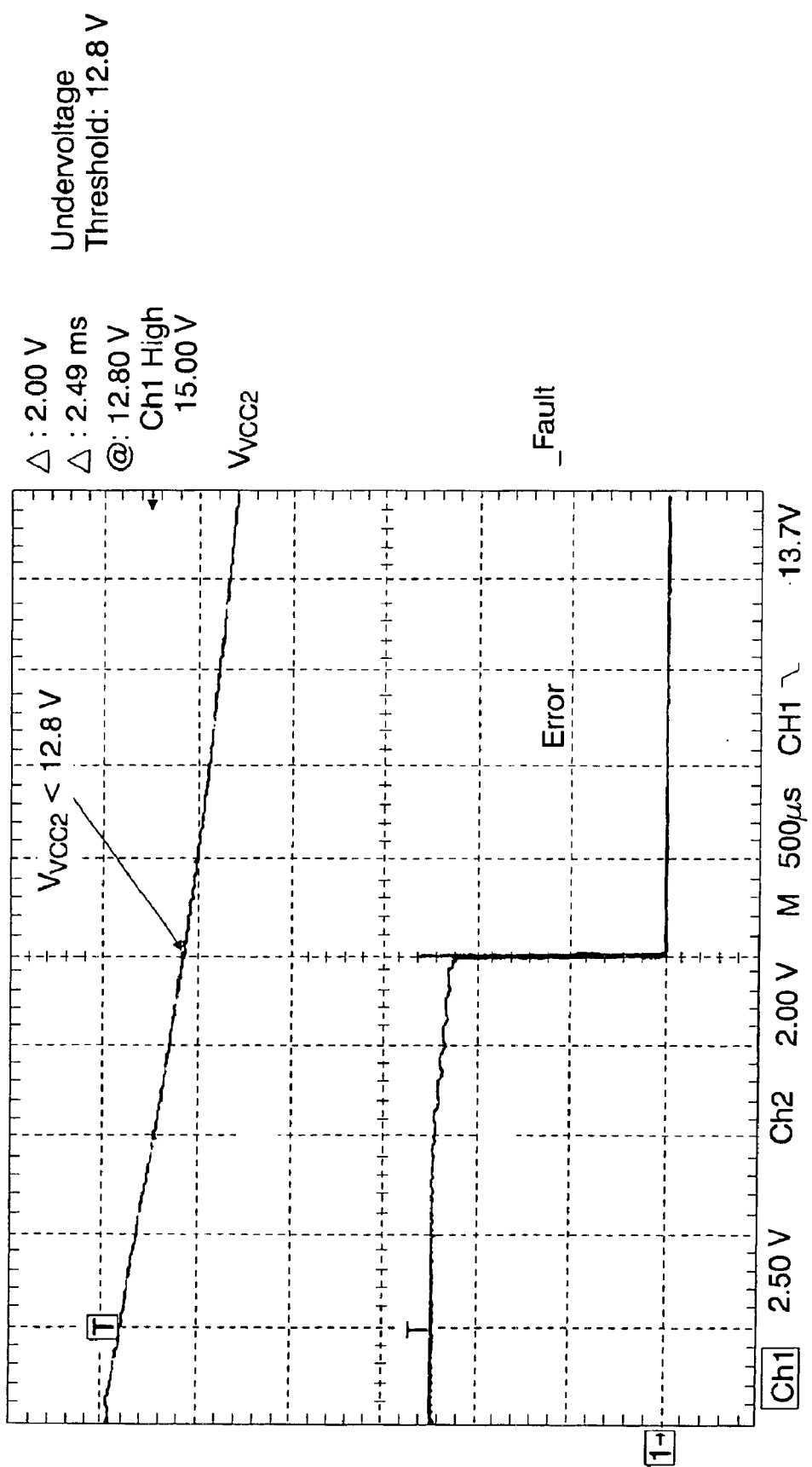
FIG. 6 shows the function of monitoring the operating voltage.

FIGS. 4 to 6 show examples of some measurements if realized switching functions.

FIG. 4 shows the driver capacity of the gate driver for the powering-on process. The signal delay on the primary side is 170–300 ns, depending on the synchronization of the input signal to the internal timing frequency (see channel 1, T1 in). For the secondary side, the delay is about 280 ns (see channel 1, T1 out). On channel 3, the measured voltage rise at the driver output Vout1 (−8 V→+15 V) is shown, and on channel 4, the capacitive load current (Iout PEAK=1.8 A, for RG=10 Ω, CL=33 nF) is shown.

FIG. 5 shows the measured powering on and off in case of error. VCE detection is accomplished through the direct connection of the IGBT collector and the appropriate gate driver via a corresponding high-voltage diode. Following a certain time lag after powering on (here, 4.1 μs, channel 2, $V_{DESAT1}$), the forward voltage at the IGBT should have dropped below a certain limit (in this case 7 V). Otherwise, there is a short circuit at the IGBT, and it is powered off (see channel 3 and 4 at about 8 μs). The corresponding powering-off process is soft, i.e. the gate discharge current is small due to a higher-impedance driver stage (see channel 4, Iout PEAK=0.2 A), and the powering-off process lasts about 6 μs. This prevents high voltage peaks when the short-circuit current is turned off. The VCE threshold and the lag time can be varied at the driver.

FIG. 6 shows by way of example the function of monitoring the operating voltage. For the 15 V operating voltage (VD+, VCC2), the error threshold lies at about 12,8 V (over VE), for the internally generated 5 V voltage (VDD) at about 3.0 V (over VD−; not shown).

Figure 7:
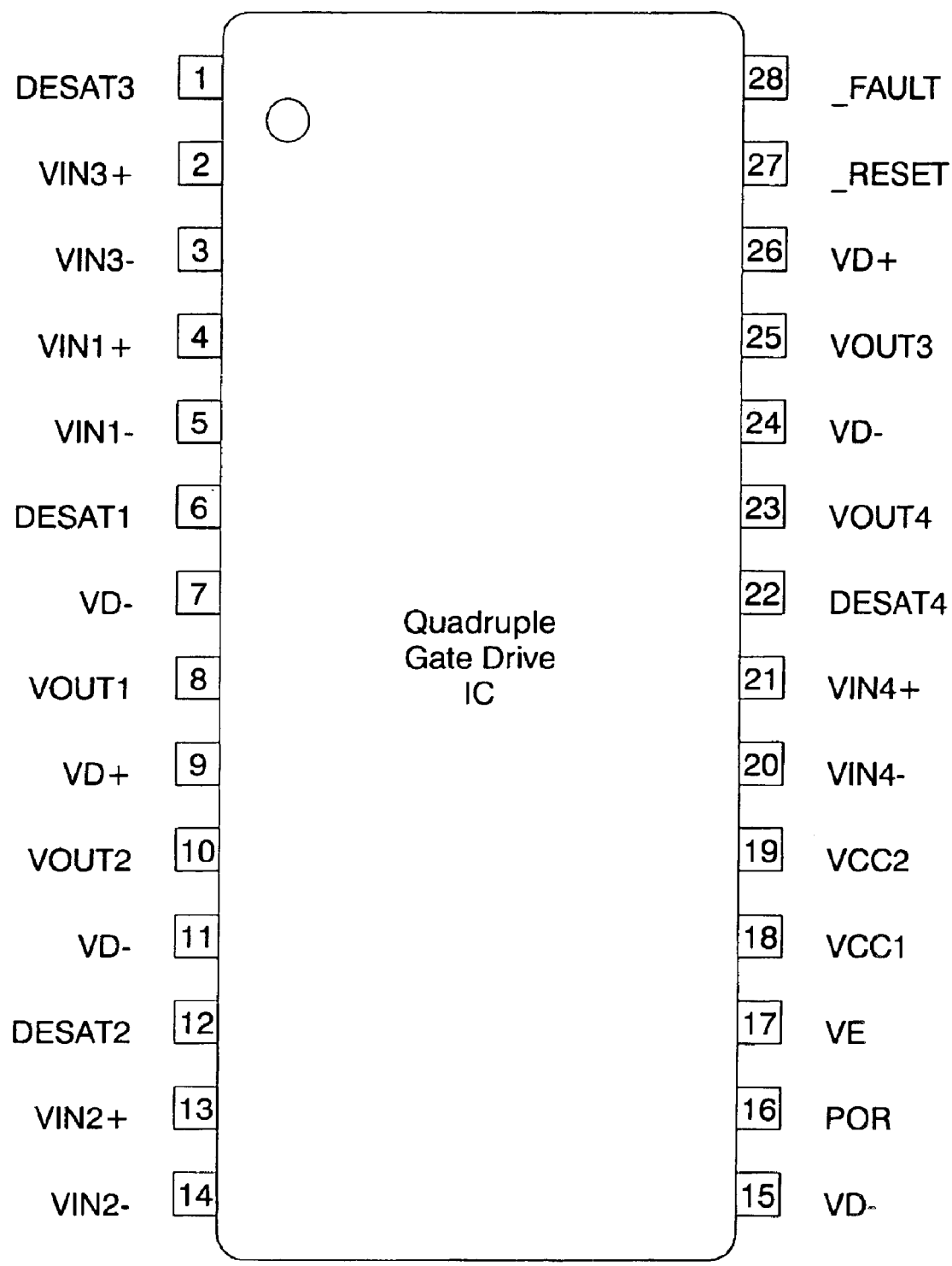
FIG. 7 shows the connections of the quadruple-gate driver IC.

FIG. 7 shows the connections of the quadruple-gate driver IC by way of the example of a 28-pin small outline package (SOP 28). Table 1 defines the inputs and outputs of the IC.

TABLE 1

PIN arrangement for SOP 28 housing (FIG. 7)

| Port | Symbol | Description |
|---|---|---|
| 1 | DESAT3 | Port high-voltage diode for VCE monitoring IGBT3 |
| 2 | VIN3+ | Control input IGBT3, High active |
| 3 | VIN3− | Control input IGBT3, Low active |
| 4 | VIN1+ | Control input IGBT1, High active |
| 5 | VIN1− | Control input IGBT1, Low active |
| 6 | DESAT1 | Port high-voltage diode for VCE monitoring IGBT1 |
| 7 | VD− | Operating voltage for powering off IGBT (variable 0 V to −15 V) |
| 8 | VOUT1 | Output to gate IGBT1 |
| 9 | VD+ | Operating voltage for powering on IGBT (+15 V) |
| 10 | VOUT2 | Output to gate IGBT2 |
| 11 | VD− | Operating voltage for powering off IGBT (variable 0 V to −15 V) |
| 12 | DESAT2 | Port high-voltage diode for VCE monitoring IGBT2 |
| 13 | VIN2+ | Control input IGBT2, High active |
| 14 | VIN2− | Control input IGBT2, Low active |
| 15 | VD− | Operating voltage for powering off IGBT (variable 0 V to −15 V) |
| 16 | POR | Power-on reset |
| 17 | VE | Reference potential; |
| 18 | VCC1 | Operating voltage 5 V |
| 19 | VCC2 | Operating voltage 15 V |
| 20 | VIN4− | Control input IGBT4, Low active |
| 21 | VIN4+ | Control input IGBT4, High active |
| 22 | DESAT4 | Port high-voltage diode for VCE monitoring IGBT4 |
| 23 | VOUT4 | Output to gate IGBT4 |
| 24 | VD− | Operating voltage for powering off IGBT (variable 0 V to −15 V) |
| 25 | VOUT3 | Output to gate IGBT4 |
| 26 | VD+ | Operating voltage for powering on IGBT (+15 V) |

TABLE 1-continued

PIN arrangement for SOP 28 housing (FIG. 7)

| Port | Symbol | Description |
|------|--------|-------------|
| 27 | RESET | Input for reset impulse from controller |
| 28 | FAULT | Output for error message |

The advantages of the control IC over hybrid or discrete solutions consist in the high integration density of various digital, analogue and driver functions which result in a reduction of the number of discrete components and thus to a reduction in the failure rate of the system and to lower costs. Another major consideration is the improvement of switching characteristics through monolithic integration. The integrated circuit is less susceptible to interference voltages and temperature drift than circuits of discrete design.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor component for gating power semiconductor switches in high-performance converters, comprising:
    an input-level conversion block connected to input signals on a primary side of the semiconductor component;
    a startup logic circuit coupled to an output level conversion block and an error memory within the semiconductor component;
    wherein the startup logic circuit blocks driver circuits while the semiconductor component operating voltages are running up after startup;
    a short-circuit monitoring circuit connected to collector-emitter paths of the power semiconductor switches;
    gate drivers coupled to the driver circuits for gating in normal operation as well as in case of a short circuit;
    a voltage generation circuit coupled to input voltages at the primary side of the semiconductor;
    a second monitoring circuit connected to internal operating voltages; and
    error recognition and processing logic circuits coupled to at least the input level conversion block, the second monitoring circuit, and the short-circuit monitoring circuit.

2. Semiconductor component for gating power semiconductor switches in high-performance converters according to claim 1, wherein several of said power semiconductor switches are monolithically integrated.

3. The semiconductor component according to claim 1, further comprising:
    four integrated, identically constructed gate drivers connected in a three-phase bridge circuit;
    wherein the gate drivers gate and monitor three BOTTOM switches and an additional switch that controls one of a brake and a reactive-power improvement circuit.

4. The semiconductor component according to claim 3, wherein the second monitoring circuit further comprises an undervoltage monitoring circuit that monitors internally generated and externally applied operating voltages; and
    wherein in the event of errors results in the regulated powering-off of all power switches of the three-phase bridge circuit.

5. The semiconductor component according to claim 3, wherein the error recognition circuits, during registration of a malfunction of a power semiconductor switch controlled by the semiconductor component, set the error memory that is integrated in the driver logic circuit connected to the malfunctioning switch;
    wherein said power semiconductor switch is softly powered off, and a global error memory is set which causes all other power semiconductor switches controlled through the semiconductor component to be powered off, and wherein the error information is transmitted to primary-side control circuits so as to power off the other power semiconductor switches of the three-phase bridge circuit.

6. Semiconductor component according to claim 5, characterized in that
    the gate voltage is monitored during soft powering off at the gate of the power switch and that when the voltage falls below a defined threshold value, the further powering-off process is shorted by means of hard powering off.

7. The semiconductor component according to claim 1, wherein the input-level conversion block further comprises a short-impulse suppression circuit that suppresses interference signals; and
    wherein the input-level conversion block accomplishes a level conversion of the input signals on the internal signal level of the integrated circuit, and accomplishes signal delay adaptation of the primary-side gating signals for all power semiconductor switches to be controlled.

8. The semiconductor component according to claim 1, wherein the error recognition circuit and the short-circuit monitoring circuit monitor the collector-emitter path voltage of the power semiconductor switches.

9. The semiconductor component according to claim 1, wherein the voltage generation circuit generates a constant voltage whose reference potential is an externally applied variable operating voltage for powering off the power switches.

10. The semiconductor component according to claim 1, wherein the startup logic circuit safely prevents a bridge short circuit during startup of the converter by releasing the driver circuits when all operating voltage thresholds are reached; and
    wherein the internal error memories are reset at that time.

11. The semiconductor component according to claim 1, wherein the gate drivers include a p-MOSFET for hard powering on, and an n-MOSFET for hard powering off and an n-MOSFET for soft powering off in case of a short circuit, which has only a fraction of the current capacity in comparison with the transistor (n-MOSFET) for hard powering off.

12. The semiconductor component according to claim 1, wherein, following a malfunction and a primary-side reset signal, all error memories are deleted, and a regulated restart of the driver circuit is caused if an error no longer exists.

* * * * *

UNITED STATES PATENT AND TRADEMARK OFFICE
CERTIFICATE OF CORRECTION

PATENT NO. : 6,851,077 B2
DATED : February 1, 2005
INVENTOR(S) : Reinhard Herzer et al.

It is certified that error appears in the above-identified patent and that said Letters Patent is hereby corrected as shown below:

<u>Title page,</u>
Item [73], Assignee, please delete "Semikron Elektronik GmbH, Nuremberg (DE)" and substitute with -- Semikron Elektronik GmbH, Nurenberg (DE) --.

Signed and Sealed this

Tenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,851,077 B2  Page 1 of 1
APPLICATION NO. : 09/815165
DATED : February 1, 2005
INVENTOR(S) : Reinhard Herzer et al.

It is certified that error appears in the above-identified patent and that said Letters Patent is hereby corrected as shown below:

<u>Title page,</u>
Item [73], Assignee, please delete "Semikron Elektronik GmbH, Nuremberg (DE)" and substitute with -- Semikron Elektronik GmbH, Nurnberg (DE) --.

This certificate supersedes Certificate of Correction issued May 10, 2005.

Signed and Sealed this

Thirteenth Day of March, 2007

JON W. DUDAS
*Director of the United States Patent and Trademark Office*